United States Patent
Fung et al.

(10) Patent No.: US 8,198,347 B2
(45) Date of Patent: Jun. 12, 2012

(54) HIGH THERMAL-CONDUCTIVE, HALOGEN-FREE, FLAME-RETARDANT RESIN COMPOSITION, AND PREPREG AND COATING THEREOF

(75) Inventors: Dein-Run Fung, Taipei (TW); Te-Chao Liao, Taipei (TW); Hao-Sheng Chen, Taipei (TW)

(73) Assignee: Nan Ya Plastics Corporation, Taipei (TW)

( * ) Notice: Subject to any disclaimer, the term of this patent is extended or adjusted under 35 U.S.C. 154(b) by 54 days.

(21) Appl. No.: 12/588,940

(22) Filed: Nov. 3, 2009

(65) Prior Publication Data

US 2010/0163783 A1 Jul. 1, 2010

(30) Foreign Application Priority Data

Dec. 29, 2008 (TW) .............................. 97151158 A

(51) Int. Cl.
*C08L 63/00* (2006.01)
*C08G 59/30* (2006.01)
*C08G 59/38* (2006.01)
*B32B 27/38* (2006.01)

(52) U.S. Cl. ........ 523/433; 523/427; 523/435; 523/440; 523/442; 523/443; 523/457; 523/458; 523/466; 525/525

(58) Field of Classification Search ................ 523/427, 523/433, 435, 440, 442, 443, 457, 458, 466; 525/523, 524, 525

See application file for complete search history.

(56) References Cited

U.S. PATENT DOCUMENTS

| | | | | |
|---|---|---|---|---|
| 5,391,924 A | * | 2/1995 | Uchida et al. | 257/789 |
| 6,001,901 A | * | 12/1999 | Shiobara et al. | 523/443 |
| 6,291,627 B1 | * | 9/2001 | Wang et al. | 528/99 |
| 2003/0073781 A1 | * | 4/2003 | Hwang et al. | 525/107 |
| 2004/0102597 A1 | * | 5/2004 | Tobita et al. | 528/44 |

FOREIGN PATENT DOCUMENTS

CA 2061093 A * 8/1992

* cited by examiner

*Primary Examiner* — Michael J Feely
(74) *Attorney, Agent, or Firm* — Bacon & Thomas, PLLC

(57) ABSTRACT

A high thermal-conductive, halogen-free and flame-retardant resin composition used as a dielectric layer of a printed circuit board comprises 5% to 70% of phosphorus-containing epoxy resin, at most 50% of multifunctional or bifunctional epoxy resin, 1% to 20% of curing agent, 0.01% to 10% of accelerant, at most 20% of inorganic powder, 5% to 85% of high thermal conductivity powder and 0.01% to 10% of processing aids, which resin composition has excellent thermal conductivity, heat resistance and flame retardancy as well as being environmentally friendly for free of halogen flame retardant and no toxic or corrosive gases when burning; the resin composition is used to form as a high thermal-conductive prepreg by impregnation or form as a high thermal-conductive coating by coating and then further used as a dielectric layer on a printed circuit board for demonstrating if electronic components formed thereon the printed circuit board has high thermal-conductivity and efficient heat dissipation capable of improving long service life and enhanced stability of electronic components.

8 Claims, 1 Drawing Sheet

HIGH THERMAL-CONDUCTIVE, HALOGEN-FREE, FLAME-RETARDANT RESIN COMPOSITION, AND PREPREG AND COATING THEREOF

BACKGROUND OF THE PRESENT INVENTION

1. Field of the Present Invention

The present invention relates to a resin composition, and more particularly, to a resin composition having halogen-free, flame-retardant and high thermal conductive capable of being formed as a dielectric layer on a printed circuit board (PCB).

2. Description of Related Art

For making a traditional UL94-V0 flame-retardant FR4 printed circuit board (PCB), reaction between tetrabromo-bisphenol and a plethora of epoxy resin is implemented to obtain a resin with two end-epoxy groups that is further mixed with a curing agent and an accelerant to form a prepreg to be constructed upon glass fiber cloth before thermally hardened so as to endow the PCB with flame retardancy. Alternatively, tetrabromobisphenol may be mixed with other epoxy hardeners before joining the cure reaction with epoxy resin, so as to produce cured epoxy resin that is flame-retardant. Since tetrabromobisphenol is a halogen flame retardant, it emits dioxin or benzofuran and other irritant, corrosive pernicious gases when burning. In addition, a low-molecular-weight smoke suppressing agent tends to deteriorate the resulting material by weakening mechanical properties and photolysis thereof. Also, the transfer and volatility of the smoke suppressing agent in the material may have adverse effects on the physical properties and flame retardancy of the material.

Recently, with the trend toward high-density integrated circuit configuration, accumulation of heat generated from electronic components tends to aggravate and thus conventional epoxy resin becomes inadequate for IC applications in respect of thermal conductivity. While an insulating layer (also known as a dielectric layer) applied to a metal base board has been disclosed in Japan Patent No. 05-267808 for improved thermal conductivity, the aforementioned material is unproven as UL94-V0 rating flame-retardant and has its application limited to single-layer boards only. On the other hand, although U.S. Pat. No. 6,187,416 has disclosed a halogen-free, phosphorous-free resin, it does not state whether the resin has high thermal conductivity and conforms with the UL94-V0 flame-retardant standard.

In view of the shortcomings of the prior arts, there is a need for a halogen-free, flame-retardant and high thermal-conductive resin composition for being applied to PCBs so as to answer to the request of modern electronic products where compactness and integrity are required.

SUMMARY OF THE INVENTION

The primary objective of the present invention is to provide a high thermal-conductive, halogen-free and flame-retardant resin composition. The resin composition comprises 5% to 70% of phosphorus-containing epoxy resin, at most 50% of multifunctional or bifunctional epoxy resin, 1% to 20% of curing agent, 0.01% to 10% of accelerant, at most 20% of inorganic powder, 5% to 85% of high thermal conductivity powder, and at most 10% of processing aids, each based on the total weight of the resin composition.

The resin composition of the present invention is also advantageous for not only having excellent heat resistance and flame retardancy, but also being an environmentally friendly material that generates no toxic or corrosive gases when burning because it is free of a halogen flame retardant. Then, the resin composition may be formed as a high thermal-conductive prepreg by an impregnation process or formed as a high thermal-conductive coating by a coating process and used as a dielectric layer on a printed circuit board (PCB) so as to endow the PCB with high thermal-conductivity required for rapid dissipation of heat generated by the PCB in operation, and thereby ensures durability and stability of electronic components on the PCB.

BRIEF DESCRIPTION OF THE DRAWINGS

The invention as well as a preferred mode of use, further objectives and advantages thereof will be best understood by reference to the following detailed description of illustrative embodiments when read in conjunction with the accompanying drawings, wherein.

DETAILED DESCRIPTION OF THE PREFERRED EMBODIMENTS

Figure 1:
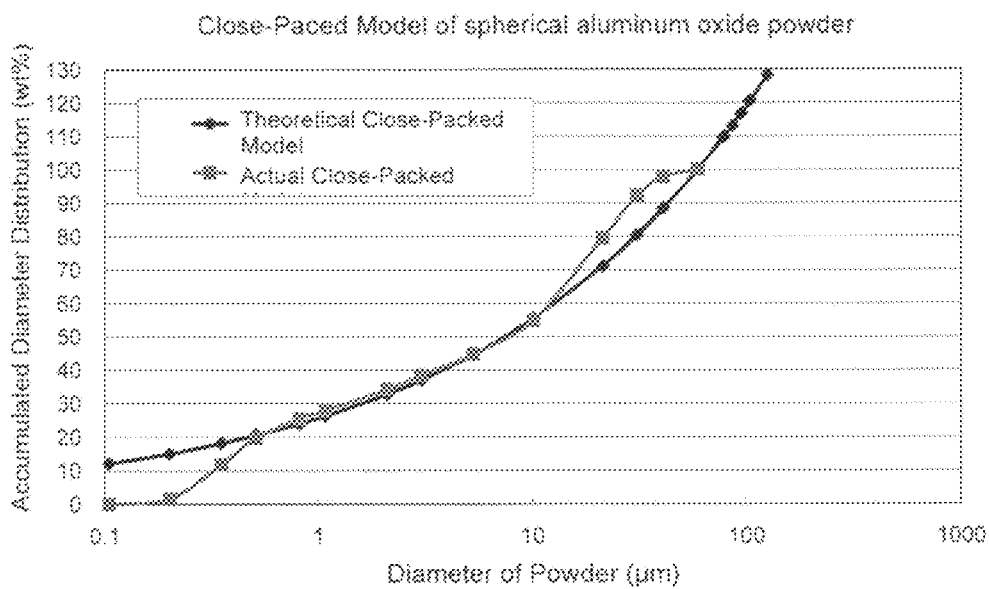
FIG. 1 is a graph showing actual and theoretical close-packed model of spherical aluminum oxide powder (A/B=9/1) with different diameters.

The present invention discloses a resin composition that is halogen-free, flame-retardant and high thermal-conductive. When the resin composition is used to form a dielectric layer on a printed circuit board (PCB), heat generated by electronic components on the PCB in operation can be rapidly dissipated, so as to improve durability and stability of the electronic components on the PCB.

The high thermal-conductive, halogen-free and flame-retardant resin composition of the invention, based on the total weight of the resin composition, comprises:

(1) 5% to 70% of phosphorus-containing epoxy resin;
(2) at most 50% of multifunctional or bifunctional epoxy resin,
(3) 1% to 20% of curing agent;
(4) 0.01% to 10% of accelerant for accelerating cross linking between the epoxy resin and the curing agent in an amount-dependent manner;
(5) at most 20% of inorganic powder for enhancing rigidity of the resin composition after the resin composition is cured, wherein the inorganic powder is dispensable if rigidity is not required;
(6) 5% to 85% of high thermal conductivity powder, wherein the resin composition has inferior thermal conductivity when containing less than 5% of the high thermal conductivity powder, and has its processability and physical properties adversely affected when containing more than 85% of the high thermal conductivity powder; and
(7) 0.01% to 10% of processing aids comprising one or more agents selected from the group consisting of a coupling agent, a reinforcing filler, a plasticizer, a dispersing agent, an anti-oxidant, a heat-and-light stabilizers, a flame retardant agent, a stuffing, a pigment and a dye, wherein the coupling agent serves to improve interfacial surface affinity between the resin and the inorganic powder and/or the high thermal conductivity powder while the other aids are for improving processability, mechanical and physical properties, thermal properties and light stability of the resin composition.

The phosphorus-containing epoxy resin may be used solely or mixed with multifunctional or bifunctional epoxy resin selectively according to processability, physical properties and form of the intended dielectric layer (e.g. prepreg or RCC), while the multifunctional or bifunctional epoxy resin shall not be used solely.

The phosphorus-containing epoxy resin in the high thermal-conductive, halogen-free and flame-retardant resin composition of the present invention is formed through an addition reaction whereby reactive hydrogen atoms of a phosphorus-containing compound are directly bonded to epoxy groups of the multifunctional or bifunctional epoxy resin, and at lease comprises a chemical structure selected from the group consisting of formulas (a) through (d) below:

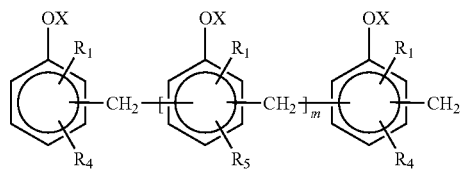
(a)

where
$0 \leq m < 12$, m is an integer;
$R_1$=H or $C_1$-$C_4$ alkyl; and
$R_4$ and $R_5$ are independently hydrogen, methyl, or

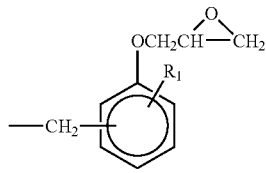

where $R_1$ is as defined above; and
X=A or B, and at least one X is B, wherein

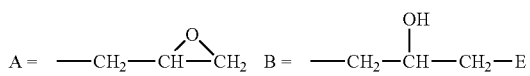

wherein E is

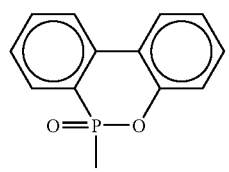

wherein E is

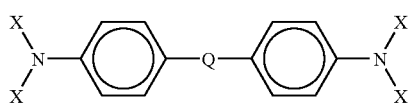
(b)

where X is as defined above; and
Q is

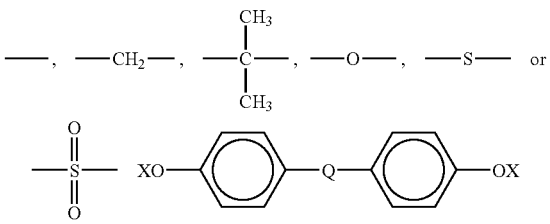
(c)

where X and Q are as defined above; and

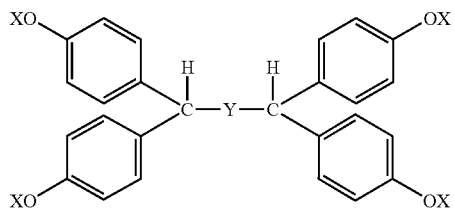
(d)

where X is as defined above; and
Y is —($CH_2$)— or phenylene,
where $0 < n < 6$ and n is an integer.

The epoxy resin used in the high thermal-conductive, halogen-free and flame-retardant resin composition of the present invention may be multifunctional or bifunctional epoxy resin having an epoxy equivalent weight (EEW) of 100-2000 g/eq and is at least one selected from the group consisting of bisphenol-A epoxy resin, bisphenol-F epoxy resin, butadiene epoxy resin, o-cresol Novolac epoxy resin, phenol-formaldehyde Novolac epoxy resin, phenol-dibenzoyl-formaldehyde Novolac epoxy resin, phenol-p-xylene-formaldehyde Novolac epoxy resin, phenol-diphenylene-formaldehyde Novolac epoxy resin, phenol-dicyclopentadiene-formaldehyde Novolac epoxy resin, benzaldehyde Novolac epoxy resin, bisphenol-A-formaldehyde Novolac epoxy resin and resorcinol Novolac epoxy resin.

The curing agent used in the high thermal-conductive, halogen-free and flame-retardant resin composition of the present invention is at least one selected from the group consisting of amines, acid anhydrides, phenolic resins, polythiol compounds, isocyanate compounds, block isocyanate compounds and alkyd resins, wherein the curing agent is more preferably selected from amines, phenolic resins, anhydrides, and diverse mixtures thereof.

The amines used as the curing agent may be selected from aliphatic amines (such as diethylenetriamine, triethylenetetramine, tetraethylenepentamine, diethylaminopropylamine and ethylenediamine), polyamide-polyamines, alicyclic compounds (such as bis(4-amino-3-methylcyclohex)methane and bis(4-aminocyclohexyl)methane), aromatic compounds (such as m-phenylenebis(methylamine), methylenedianiline, sulfonyldianiline, and m-phenylene diamine), dicyandiamides, adipohydrazides, primary amines, secondary amines, and tertiary amines.

The anhydrides used as the curing agent may be selected from styrene-maleic anhydride, phthalic anhydride, tetrahydrophthalic anhydride, methyl hexahydrophthalic anhydride, methyl nadic anhydride, dodecenyl succinic anhydride, chlorendic anhydride, benzenetetracarboxylic anhydride, benzophenonetetracarboxylic dianhydride, ethylene bis(trimellitic anhydride), methylcyclohexenyl tetracarboxylic dianhydride, trimellitic anhydride, and polyazelaic polyanhydride.

The phenolic resins used as the curing agent may be selected from o-cresol Novolac resin, phenol-formaldehyde Novolac resin, phenol-dibenzoyl-formaldehyde Novolac resin, phenol-p-xylene-formaldehyde Novolac resin, phenol-diphenylene-formaldehyde Novolac resin, phenol-dicyclopentadiene-formaldehyde Novolac resin, benzaldehyde Novolac resin, bisphenol-A-formaldehyde Novolac resin, resorcinol Novolac resin, and melamine-phenolic-formaldehyde resin.

The accelerant used in the high thermal-conductive, halogen-free and flame-retardant resin composition of the present invention is at least one selected from the group consisting of tertiary amines and salts thereof, quaternary ammonium compounds, 2,4,6-tris(dimethylaminomethyl)phenol, dimethyl benzyl amine, imidazoles (such as 2-methyl imidazole, 2-ethyl-4-methylimidazole, 2-phenylimidazole and 1-benzyl-2-methylimidazole), tert-amyl phenol ammonium, mono-phenol compounds or polyphenol compounds (such as phenol and salicylic acid), boron trifluoride and complexes of its organic matters (such as boron trifluoride-ether complex, boron trifluoride-amine complex, and borontrifluoride monoethyl amine complex), phosphoric acid and triphenyl phosphate, wherein the accelerant is preferably selected from tertiary amines imidazoles and mixtures thereof.

The inorganic powder used in the high thermal-conductive, halogen-free and flame-retardant resin composition of the present invention is at least one selected from the group consisting of $SiO_2$, $TiO_2$, $Al(OH)_3$, $Mg(OH)_2$, $CaCO_3$ and fumed silica in the form of spherical or irregular particles. An average diameter of the inorganic powder is preferably between 0.01 and 20 micron. Therein, the fumed silica is added in the form of nano-sized silica powder having an average diameter ranging from 1 to 100 nm. The fumed silica is preferably added in an amount between 0.1 and 10 wt % and when more than 10 wt % of fumed silica is added, viscosity of the resultant resin composition can significantly increase, thus degrading processability of the resin composition.

The high thermal conductivity powder in the resin composition is at least one selected from the group consisting of metal nitrides, metal oxides, carbides, corundum and aluminum powder.

More particularly, the metal nitrides include aluminum nitride, boron nitride, and silicon nitride. The metal oxides include aluminum oxide, magnesium oxide, and zinc oxide. The carbides include silicon carbide and boron carbide. Whereas, the high thermal conductivity powder is preferably aluminum oxide, magnesium oxide, zinc oxide, boron nitride, aluminum nitride, silicon nitride or silicon carbide while more preferably being aluminum oxide or boron nitride having low dielectric constant or low hardness.

The high thermal conductivity powder is added in the form of dust, beads, fibers, chips or flakes while different forms of the high thermal conductivity powder may be blended in use.

When added in the form of dust, the high thermal conductivity powder has an average diameter ($D_{50}$) of 0.05-50 micron, preferably of 0.1-20 micron, and more preferably of 0.1-10 micron. When added in the form of fibers, the high thermal conductivity powder has an average diameter of 0.1-10 micron, and a length-diameter ratio greater than 3, preferable an average diameter of 0.1-5 micron, and a length-diameter ratio greater than 10. The fiber smaller than 0.1 micron in diameter is too small to get well blended into the resin composition while the fiber greater than 10 micron in diameter adversely affects appearance of the resin composition.

To optimize the fill ratio of the high thermal conductivity powder in the resin composition, the high thermal conductivity powder in different sizes is mixed and Horsfiel Model, a mathematical model known in powder engineering, is implemented to derive the close-packing model and close-packing curve so that the resin composition of the present invention is endowed with the optimum thermal conductivity due to the optimum fill ratio of the high thermal conductivity powder contained therein.

The finishing agents used in the high thermal-conductive, halogen-free and flame-retardant resin composition of the present invention at least comprises one agent selected from the group consisting of a coupling agent, a plasticizer, a dispersing agent, an anti-oxidant, a heat-and-light stabilizer, a flame retardant agent, a stuffing, a pigment and a dye. Therein, the coupling agent in the resin composition serves to improve interfacial surface affinity between the resin and the inorganic powder and/or the high thermal conductivity powder. The coupling agent is directly added into the resin composition. Alternatively, the inorganic powder or the high thermal conductivity powder and the coupling agent are preprocessed before used to form the resin composition. The other aids are optionally implemented according to desired physical properties, electrical properties, thermal properties and light stability of the intended PCB, or for improving the processability of the resin composition.

The coupling agent is selected from TMS, DMS, and titanium aluminate. The plasticizer is selected from dimethyl phosphate, trioctyl trimellitate, and dinonyl phosphate. The dispersing agent is selected from low-molecular-weight acid polyesters and long-chain adipic alcohols. The anti-oxidant is selected from dilauryl thiodipropionate and di-tertiary butyl-hydroxyl toluene. The heat-and-light stabilizer is benzophenone. The flame retardant agent is selected from tricresyl phosphate, triphenyl phosphate and cresyl phenyl phosphate. The stuffing is selected from calcium carbonate and molybdenum disulfide.

In practical applications, it is possible to prepare the high thermal-conductive, halogen-free and flame-retardant resin composition in the form of a high thermal conductivity prepreg formed by retting or a high thermal conductivity coating formed by coating. The high thermal-conductive, halogen-free and flame-retardant prepreg or coating is then used as a dielectric layer of a printed circuit board (PCB) so that the PCB is high thermal-conductive, halogen-free and flame-retardant.

The high thermal-conductive, halogen-free and flame-retardant prepreg is constructed upon glass fiber cloth that acts as a substrate to be retted with the resin composition. The high thermal-conductive, halogen-free and flame-retardant coating comprises a metal foil (sheet) or a plastic film as a substrate to be coated with the resin composition. Therein, the metal foil (sheet) is selected from the group consisting of an FR-4 substrate, a copper foil (sheet), an aluminum foil (sheet) and a tin foil (sheet) while the plastic film is selected from the group consisting of a polyester film, a polyolefin film, a polyvinyl chloride film, a polytetrafluoroethylene film and a polyurethane film.

When the high thermal-conductive, halogen-free and flame-retardant prepreg or high thermal-conductive, halogen-free and flame-retardant coating is applied to a PCB as a dielectric layer, the PCB is endowed with high thermal conductivity and further possesses the following advantageous features:
1. reduced dimensions;
2. enhanced current density;

3. improved thermal properties and mechanical properties of products using the PCB;
4. better durability of products using the PCB;
5. a reduced number of cooling fins and other thermal dissipation components for use with products using the PCB, and reduced volume of products using the PCB; and
6. superior mechanical durability as compared with a ceramic substrate that is relatively fragile.

While the following examples and comparative examples serve to illustrate the effects of the present invention, it is to be understood that the scope of the present invention is not limited to the recited examples.

The resin composition is used to form a copper foil substrate by any applicable process known in the art. For example, dicydianmide or polyhydric phenolic is employed as the curing agent of the composition. When so used, dicydianmide is added in an amount of 2-8 phr, preferably 2-4 phr, and polyhydric phenolic is such added that an equivalent ratio of phenol OH groups to epoxy groups ranges from 0.5 to 1.5, preferably from 0.9 to 1.1. Imidazoles or tertiary amines are used as promoters while solvents (applicable examples including N,N-Dimethylformamide (DMF), acetone and butanone) are added to adjust viscosity of the resin composition. Afterward, the resin composition is used to ret a glass fiber cloth or to coat a copper foil, and then the retted glass fiber cloth or coated copper foil is heated and dried so as to form a prepreg or an RCC (resin coated copper foil). The prepreg or RCC is later laminated to a copper foil or sandwiched between two copper foils so as to form a copper foil substrate.

EXAMPLE 1

75 parts by weight of solid phosphorus-containing epoxy resin (with epoxy equivalent weight (EEW) of 350 g/eq, containing 2.6 wt % of phosphorous, available from Nan Ya Plastics Corporation, Taiwan, NPEP-200LA70), 25 parts by weight of bisphenol-A epoxy resin (EEW=186 g/eq, available from Nan Ya Plastics Corporation, Taiwan, NPEL-128E), 34.87 parts by weight of bakelite and 0.05 parts by weight of 2-methyl imidazole are dissolved in 207.5 parts of butanone before mixed with 250.5 parts by weight of high thermal conductivity powder so as to obtain a high thermal-conductive, halogen-free and flame-retardant composition solution wherein the high thermal conductivity powder accounts for 65% of the solution.

Therein, a close packing model of the high thermal conductivity powder (250.5 parts) added into the resin solution is derived from Horsfield Model. The obtained specific structure contains 45.09 parts of spherical aluminum oxide powder A (with average diameter of $D_{50}$=5 μm), 5.01 parts of spherical aluminum oxide powder B (with average diameter of $D_{50}$=0.5 μm), and 200.4 parts of boron nitride (with average diameter of $D_{50}$=5.5 μm).

A glass fiber cloth (available from Nan Ya Plastics Corporation, Taiwan, grade 106) is retted in the above-mentioned solution, and then dried for a few minutes at 160° C. (in a retting machine), by controlling the drying time to regulate minimum melt viscosity of dried prepreg to 2000-10000 poise. Then pieces of prepreg laminate are piled up between two copper foils with thickness of 35 μm and heated at a pressure of 30 kg/cm2 and at the temperature of 85° C., while the temperature is gradually heated up to 185° C. at the heating rate of 5° C./min, held at 185° C. for 120 minutes, and then gradually cooled to 130° C., so as to obtain the copper foil substrate.

The physical properties of the obtained copper foil substrate are tested, and results of tests are shown in Table 1.

EXAMPLE 2

The formula of the resin solution is similar to that of Example 1 except that the amount of the high thermal conductivity powder added into the resin solution is increased to 539.5 parts by weight (accounting for 80% of the high thermal-conductive, halogen-free and flame-retardant composition solution). Horsfield Model is implemented to get the close packing model of the high thermal conductivity powder, and the obtained specific structure contains 97.11 parts of spherical aluminum oxide powder A (with average diameter of $D_{50}$=5 μm), 10.79 parts of spherical aluminum oxide powder B (with average diameter of $D_{50}$=0.5 μm), and 431.6 parts of boron nitride (with average diameter of $D_{50}$=5.5 μm). A comparison between the actual packing curve and the theoretical packing curve of aluminum oxide powder is shown in FIG. 1.

The physical properties of the obtained copper foil substrate are tested, and results of tests are shown in Table 1.

EXAMPLE 3

The formula of the resin solution is similar to that of Example 2 except that the solid content of the resin is adjusted to 75 wt %. The resultant resin is applied to a copper foil with thickness of 35 μm so as to form an RCC (resin coated copper foil) with coating thickness of 100 μm. Then another copper foil with thickness of 35 μm is laminated with the resin under lamination conditions as provided in Example 1. The physical properties of the obtained copper foil substrate are tested, and results of tests are shown in Table 1.

EXAMPLE 4

Figure 2:
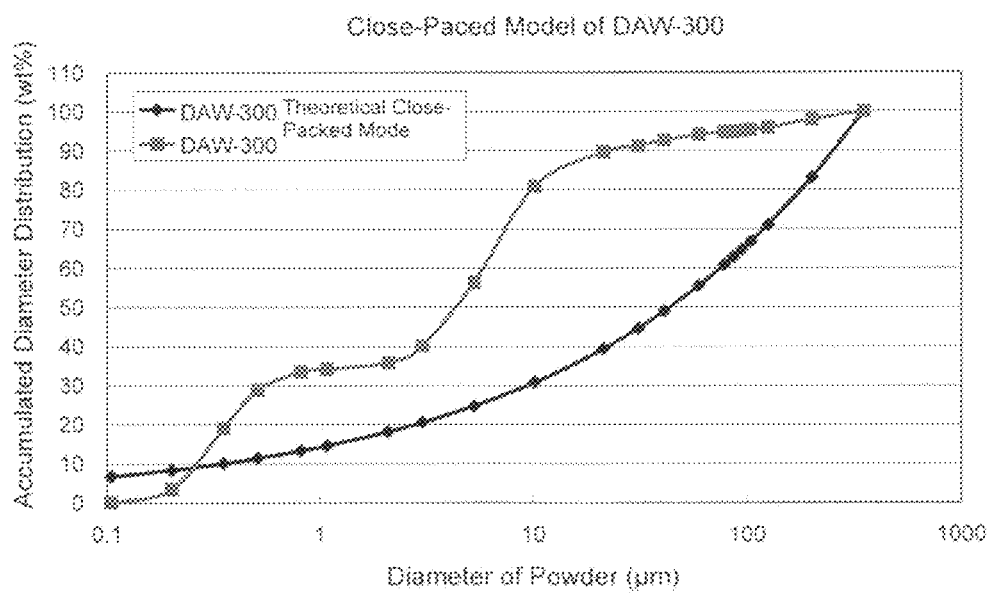
FIG. 2 is a graph showing actual and theoretical close-packed model of commercially available spherical aluminum oxide powder (DAW-300) with different diameters blended.

The formula of the resin solution and the resultant RCC are similar to that of Example 2 except that the 10.79 parts of aluminum oxide beads B are replaced by spherical aluminum oxide powder DAW-300 (Denka, Japan, DAW-45/DAW-5=1/1, average diameter $D_{50}$=4.4 μm) commercially available with different diameters blended and 431.6 parts of boron nitrides. The actual and theoretical close-packed structures of commercially available aluminum oxide powder (DAW-300) with different diameters blended are shown in FIG. 2.

The physical properties of the obtained copper foil substrate are tested, and results of tests are shown in Table 1.

COMPARATIVE EXAMPLE 1

75 parts by weight of o-cresol epoxy resin (EEW=210 g/eq, available from Nan Ya Plastics Corporation, Taiwan, NPCN-703), 25 parts by weight of bisphenol-A epoxy resin (EEW=186 g/eq, available from Nan Ya Plastics Corporation, Taiwan, NPEL-128E), 49.15 parts by weight of bakelite and 0.05 parts by weight of 2-methyl imidazole are dissolved in 401.6 parts of butanone before mixed with 596.61 parts by weight of high thermal conductivity powder so as to obtain a high thermal-conductive, halogen-free and flame-retardant composition solution wherein the high thermal conductivity powder accounts for 80% of the solution. The high thermal conductivity powder includes 107.4 parts of spherical aluminum oxide powder A (with average diameter of $D_{50}$=5 μm), 11.93 parts of spherical aluminum oxide powder B (with average diameter of $D_{50}$=0.5 μm), and 477.28 parts of boron nitride (with average diameter of $D_{50}$=5.5 μm). Then the resin solution is used to make a copper foil substrate by the process as described in Example 1.

The physical properties of the obtained copper foil substrate are tested, and results of tests are shown in Table 1.

COMPARATIVE EXAMPLE 2

The formula of the resin solution is similar to that of Example 1 except that 539.5 parts of silica is added. Then the resin solution is used to make a copper foil substrate by the process as described in Example 1.

The physical properties of the obtained copper foil substrate are tested, and results of tests are shown in Table 1.

COMPARATIVE EXAMPLE 3

The formula of the resin solution and the resultant copper foil substrate are similar to those of Example 1 except that the 539.5 parts of the high thermal conductivity powder are entirely replaced by the same amount of boron nitrides. The physical properties of the obtained copper foil substrate are tested, and results of tests are shown in Table 1.

Result

By comparing test results of Examples 1-4 and Comparative Examples 1-3 shown in Table 1, conclusions are drawn as follows:

1. Examples 1 and 2 show that when 250.5 parts and 539.5 parts of the high thermal conductivity powder are respectively added into the resin, the thermal conductivity of the resin composition are 5.2 W/m·K (Example 1) and 8.1 W/m·K (Example 2), respectively. If the RCC process is implemented (Example 3), the thermal conductivity of the resin composition will increases to 9.9 W/m·K.

2. Example 2 and Comparative Examples 1 and 2 show that (1) When phosphorus-containing epoxy resin is replaced by o-cresol epoxy resin, desired thermal conductivity is achieved, but the UL94-V0 flame retardant standard is not satisfied; and (2) When the high thermal conductivity powder is replaced by silica, the UL94-V0 flame retardant standard is satisfied, but the desired thermal conductivity is compromised. Thus, it is proven that the formula of the present invention endows the resin composition with excellent thermal conductivity while allowing the resin composition to be halogen-free and flame-retardant and to satisfy the UL94-V0 flame retardant standard for electronic products.

3. As revealed by comparison of FIG. 1 and FIG. 2, the resin composition formulated with the high thermal conductivity powder consisting of spherical aluminum oxide powder and boron nitride determined by Horsfield Model (Example 2) has the actual packing curve closest to the theoretical closest packing curve (FIG. 1) and has the thermal conductivity up to 8.1 W/m·K, which is higher than 6.2 W/m·K of the resin composition using pure boron nitride (Comparative Example 3). The resin composition formulated with commercially available blended aluminum oxide powder (Example 4) has the actual packing curve diverging from the theoretical close packing curve to the greatest extent (FIG. 2) and has a low thermal conductivity of 5.9 W/m·K.

This indicates that the closer the actual packing curve is to the theoretical closest packing curve, the more are the contacting points among the beads, which means a higher fill ratio of the powder and higher thermal conductivity of the resin composition.

TABLE 1

Formulas of Examples and Comparative Examples and Physical Properties of Prepreg and Substrate

| Item | | Example 1 | Example 2 | Example 3 | Example 4 | Comparative Example 1 | Comparative Example 2 | Comparative Example 3 |
|---|---|---|---|---|---|---|---|---|
| Process | | Prepreg | Prepreg | RCC | Prepreg | Prepreg | Prepreg | Prepreg |
| Phosphorus-Containing Epoxy Resin | | 75 | 75 | 75 | 75 | — | 75 | 75 |
| Bisphenol-A Epoxy Resin | | 25 | 25 | 25 | 25 | 25 | 25 | 25 |
| O-Cresol Epoxy Resin | | — | — | — | — | 75 | — | — |
| Curing Agent | Bakelite | 34.87 | 34.87 | 34.87 | 34.87 | 49.15 | 34.87 | 34.87 |
| Accelerant | 2-Methyl Imidazole | 0.05 | 0.05 | 0.05 | 0.05 | 0.05 | 0.05 | 0.05 |
| Solvent | Butanone | 207.5 | 363.1 | 363.1 | 363.1 | 401.6 | 363.1 | 363.1 |
| High Thermal Conductivity Powder | Aluminum Oxide A | 45.09 | 97.11 | 97.11 | — | 107.4 | — | — |
| | Aluminum Oxide B | 5.01 | 10.79 | 10.79 | — | 11.93 | — | — |
| | Aluminum Oxide DAW-300 | — | — | — | 107.9 | — | — | — |
| | Boron Nitride | 200.4 | 431.6 | 431.6 | 431.6 | 477.28 | — | 539.5 |
| Inorganic Powder | Silica | — | — | — | — | — | 539.5 | — |
| Processing aids | | 2.5 | 5.4 | 5.4 | 5.4 | 5.9 | 5.4 | 5.4 |
| Percentage Of Powder In Composition | | 65 | 80 | 80 | 80 | 80 | 80 | 80 |
| Thermal Conductivity (W/m · K)*[1] | | 5.2 | 8.1 | 9.9 | 5.9 | 9.7 | 1.2 | 6.2 |

TABLE 1-continued

Formulas of Examples and Comparative Examples and Physical Properties of Prepreg and Substrate

| Item | Example 1 | Example 2 | Example 3 | Example 4 | Comparative Example 1 | Comparative Example 2 | Comparative Example 3 |
|---|---|---|---|---|---|---|---|
| Flame Retardency (UL-94) | V0 | V0 | V0 | V0 | V2 | V0 | V0 |

Note:
*[1]Measured by Laser Flash LFA-447, Modify ASTM E1461.

What is claimed is:

1. A high thermal-conductive, halogen-free and flame-retardant resin composition, based on total weight of the resin composition, comprising:

(1) 5% to 70% of phosphorus-containing epoxy resin;

(2) at most 50% of multifunctional or bifunctional epoxy resin, (3) 1% to 20% of curing agent;

(4) 0.01% to 10% of accelerant;

(5) at most 20% of inorganic powder for enhancing rigidity if the resin composition is cured, wherein the inorganic powder having an average diameter of 0.01-20 micron(s) is at least one selected from the group consisting of $SiO_2$, $TiO_2$, $Al(OH)_3$, $Mg(OH)_3$ and $CaCO_3$ in form of beads or irregular particles;

(6) 5% to 85% of high thermal conductivity powder(s) having an average diameter of 0.1-10 micron(s) in form of dust, beads, fibers, chips or pieces, and having closest packed in highest density model by Horsfield packing model, wherein the high thermal conductivity powder is at least one selected from the group consisting of metal nitrides, metal oxides, carbides, corundum and aluminum powder; and (7) 0.01% to 10% of processing agents;

wherein the phosphorus-containing epoxy resin is formed through an addition reaction whereby reactive hydrogen atoms of a phosphorus-containing compound are directly bonded to epoxy groups of the multifunctional or bifunctional epoxy resin and at least comprises a chemical structure selected from the group consisting of formulas (a) through (d) below:

(a)

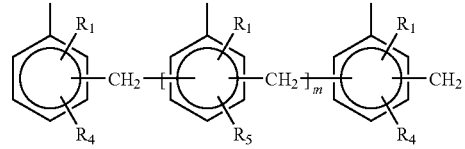

where 0<m<12, m is an integer;

$R_1$=H or $C_1$-$C_4$ alkyl; and $R_4$ and $R_5$ are independently hydrogen, methyl, or

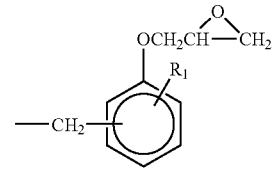

where $R_1$ is as defined above; and

X=A or B, and at least one X is B, wherein

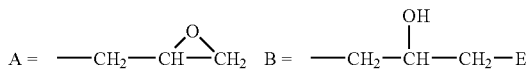

wherein E is

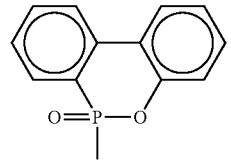

(b)

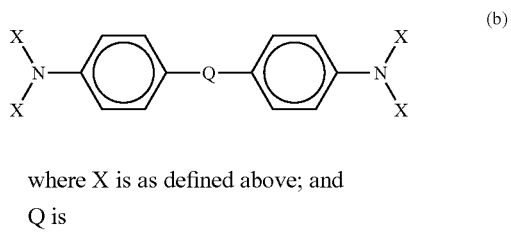

where X is as defined above; and

Q is (c)

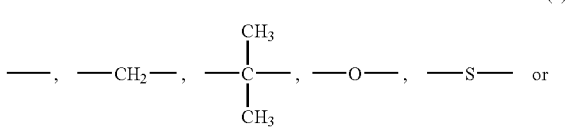

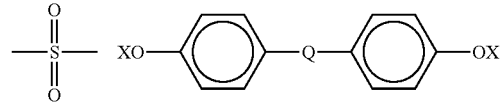

where X and Q are as defined above; and

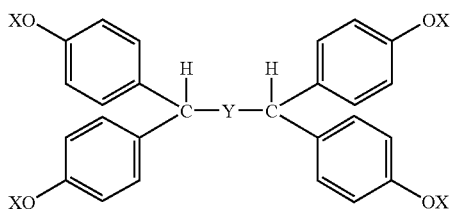
(d)

where X is as defined above; and
Y is —(CH$_2$)$_n$- or phenylene,
where 0<n<6 and n is an integer.

2. The resin composition as claimed in claim 1, wherein the multifunctional or bifunctional epoxy resin has an epoxy equivalent weight of 100-2000 g/eq and is at least one selected from the group consisting of bisphenol-A epoxy resin, bisphenol-F epoxy resin, butadiene epoxy resin, o-cresol Novolac epoxy resin, phenol-formaldehyde Novolac epoxy resin, phenol-dibenzoyl-formaldehyde Novolac epoxy resin, phenol-p-xylene-formaldehyde Novolac epoxy resin, phenol-diphenylene-formaldehyde Novolac epoxy resin, phenol-dicyclopentadiene-formaldehyde Novolac epoxy resin, benzaldehyde Novolac epoxy resin, bisphenol-A-formaldehyde Novolac epoxy resin, and resorcinol Novolac epoxy resin.

3. The resin composition as claimed in claim 1, wherein the curing agent is at least one selected from the group consisting of amines, acid anhydrides, phenolic resins, polythiol compounds, isocyanate compounds, block isocyanate compounds and alkyd resins.

4. The resin composition as claimed in claim 1, wherein the accelerant is at least one selected from the group consisting of tertiary amines and salts thereof, quaternary ammonium compounds, 2,4,6-tris(dimethylaminomethyl)phenol, dimethyl benzyl amine, imidazoles, 2-methyl imidazole, 2-ethyl-4-methylimidazole, 2-phenylimidazole, 1-benzyl-2-methylimidazole, tert-amyl phenol ammonium, mono-phenol compounds, polyphenol compounds, phenol acid, salicylic acid, boron trifluoride, boron trifluoride-ethylether complex, boron trifluoride-amine complex, borontrifluoride monoethyl amine complex, phosphoric acid and triphenyl phosphate.

5. The resin composition as claimed in claim 1, wherein the metal nitrides include aluminum nitride, boron nitride or silicon nitride.

6. The resin composition as claimed in claim 1, wherein the metal oxides include aluminum oxide, magnesium oxide or zinc oxide.

7. The resin composition as claimed in claim 1, wherein the carbides include silicon carbide or boron carbide.

8. The resin composition as claimed in claim 1, wherein the processing aids is at least one selected from the group consisting of a stuffing, a coupling agent, a reinforcing filler, a plasticizer, a dispersing agent, an anti-oxidant, a heat-and-light stabilizer, a flame retardant agent, a pigment and a dye.

* * * * *